United States Patent
Tseng et al.

(10) Patent No.: US 6,506,543 B1
(45) Date of Patent: Jan. 14, 2003

(54) METHOD OF PHOTOLITHOGRAPHY USING SUPER-RESOLUTION NEAR-FIELD STRUCTURE

(75) Inventors: Tzu-Feng Tseng, Hsinchu Hsien (TW); Wen-Rei Guo, Chiayi Hsien (TW); Kuei-Yen Wu, Hsinchu (TW)

(73) Assignee: Ritek Corporation, Hsinchu (JP)

( * ) Notice: Subject to any disclaimer, the term of this patent is extended or adjusted under 35 U.S.C. 154(b) by 22 days.

(21) Appl. No.: 09/693,080

(22) Filed: Oct. 20, 2000

(30) Foreign Application Priority Data

Jul. 24, 2000 (TW) ...................... 891147941 A

(51) Int. Cl.[7] ............... G03C 5/00; G11B 7/26
(52) U.S. Cl. ............ 430/311; 430/320; 430/321; 430/5; 430/945; 430/24; 430/270.13; 369/283; 369/284; 369/286
(58) Field of Search .......... 430/24, 311, 320, 430/321, 945, 270.13, 5; 369/283, 284, 286

(56) References Cited

U.S. PATENT DOCUMENTS 6,087,067 A * 7/2000 Kato et al. .......... 430/270.13
6,254,966 B1 * 7/2001 Kondo .................. 428/156
6,285,652 B1 * 9/2001 Tsai et al. ............. 369/275.1

* cited by examiner

Primary Examiner—Mark F. Huff
Assistant Examiner—Daborah Chacko-Davis
(74) Attorney, Agent, or Firm—J.C. Patents

(57) ABSTRACT

A method of photolithography using super-resolution near-field structure. A super-resolution near-field structure is formed on a semiconductor chip comprising a substrate and a photoresist layer thereon. An incident light beam penetrates through the super-resolution near-field structure to expose the photoresist layer. While penetrating through the super-resolution near field structure, the intensity of the incident light beam is increased, and the aperture of the light beam is reduced. As a result, the line width of the pattern formed on the photoresist layer is narrowed. The super-resolution near-field structure has a first dielectric layer, a second dielectric layer and an active layer sandwiched between the first and the second dielectric layers. The active layer is formed of one of gallium (Ga), germanium (Ge), arsenic (As), selenium (Se), indium (In), tin (Sn), antimony (Sb), tellurium (Te), and silver (Ag). Or alternatively, the active layer can be formed of one of the materials of gallium oxide, germanium oxide, arsenic oxide, selenium oxide, indium oxide, tin oxide, antimony oxide, tellurium oxide and silver oxide.

30 Claims, 7 Drawing Sheets

METHOD OF PHOTOLITHOGRAPHY USING SUPER-RESOLUTION NEAR-FIELD STRUCTURE

CROSS-REFERENCE TO RELATED APPLICATION

This application claims the priority benefit of Taiwan application serial no. 89114791, filed Jul. 24, 2000.

BACKGROUND OF THE INVENTION

1. Field of the Invention

The invention relates in general to a method of photolithography using super-resolution near-field structure. More particularly, this invention relates to a method of photolithography using super-resolution near-field structure to form a pattern with a smaller line width on a photoresist layer.

2. Description of the Related Art

Photolithography process is one of the most crucial steps in semiconductor fabrication process. Through photolithography, the layout of the integrated circuit can be transferred into the semiconductor chip. Typically, a pattern is designed on a photomask. Via exposure and etching processes, the pattern is transferred from the photomask to the photoresist layer with a certain proportion.

Referring to FIG. 1 to FIG. 4, a conventional photolithography process to pattern dimensions and positions of a metal line on a semiconductor chip is shown. In FIG. 1, a semiconductor chip 10 comprises a substrate 22 and a photoresist layer 24 formed on the substrate 22. The substrate 22 further comprises a silicon substrate 12, doped regions 14 on the silicon substrate 12, an insulating layer 16 formed of silicon oxide compound on the silicon substrate 12. Contact plugs 18 are formed in the insulating layer 16 to electrical connect the doped regions 18 and a metal layer 20 formed on the insulating layer 16.

A positive or negative photoresist layer 24 is formed is formed on the metal layer 20. When a positive photoresist layer is used, during the photochemical transformation of the exposure process, a light beam penetrates through the photomask pattern to be incident onto the photoresist layer 24. The portion of the photoresist layer which has not been incident by the light beam is remained by development and cleaning process, while the portion of the photoresist layer which has exposed is removed. A hard mask with the identical pattern on the photomask is thus formed on the semiconductor chip 22. In contrast, if a negative photoresist layer is in use, the exposed portion is to be remained, while the portion which has not be exposed is to be removed during the subsequent development and cleaning process. In this conventional method illustrated in FIG. 1 to FIG. 4, a positive photoresist layer is used as an example.

In FIG. 2, a photomask 30 including a transparent glass or quartz substrate 32 is provided. Non-transparent chromium pattern 34 are formed on the substrate 32. After the pattern is formed, an exposure step is performed on the photoresist layer 24 using the photomask 30. The semiconductor chip 10 is then disposed in a developer to perform a development step. Referring to FIG. 3, a top view of the semiconductor chip 10 is shown. After the development step, several cleaning steps are required to remove the developer and the resolved positive photoresist layer 24 on the semiconductor chip 10. As shown in FIG. 4, after the cleaning steps, an etching step is performed using the remaining photoresist layer 26 as a hard mask to remove the metal layer 24 which has not been covered by the remaining photoresist layer 26 until the insulating layer 16 is exposed. The remaining photoresist layer 26 is then removed, followed by formation of the patterned metal lines 28 in contact with the metal plugs 18.

As the complexity and integration keep increasing, the pattern 32 on the photomask 30 has to be designed smaller and smaller. However, while transferring the pattern, the critical dimension of the pattern transferred by exposure is restricted to the resolution limit of the optical exposure tool. As a result, while performing exposure to transfer a high density photomask pattern 34 into the photoresist pattern 26 on the semiconductor chip 10, optical proximity effect is easily to occur. The photoresist layer is thus over exposed or under exposed to cause resolution loss. The critical dimension of the pattern is consequently shrunk result in a transferred photoresist pattern that is not identical to the photomask pattern. The device performance is thus seriously affected.

SUMMARY OF THE INVENTION

The invention provides a method of photolithography using super-resolution near-field structure to form a pattern with a narrow line width.

A method of photolithography using a super-resolution near-field structure is provided. The method of photolithography is applied to pattern a photoresist pattern on a semiconductor chip. The semiconductor chip comprises a substrate and a photoresist layer on the substrate. A super-resolution near-field structure is formed on the photoresist layer. The super-resolution near-field structure comprises a first dielectric layer, a second dielectric layer and an active layer sandwiched between the first and the second dielectric layer. A light beam is incident on the semiconductor chip. The light beam transmits through the super-resolution near-field structure to expose the photoresist layer. Transmitting through the super-resolution near-field structure, the light intensity of the light beam is increased, while the aperture thereof is reduced.

In the invention, using the super-resolution near-field structure, the aperture of the exposure light source can be reduced, and the light intensity can be increased to breakthrough the resolution limit of a machine. Thus, to form a photoresist layer with a line width breaking the resolution limit is possible. By adjusting the thickness of the thin film of the super-resolution near-field structure, the aperture of the exposure light source can be shrunk, the dimension of the exposed spot on the photoresist layer is no more restricted by the resolution limit of the exposure machine.

Both the foregoing general description and the following detailed description are exemplary and explanatory only and are not restrictive of the invention, as claimed.

DESCRIPTION OF THE PREFERRED EMBODIMENTS

Figure 1:
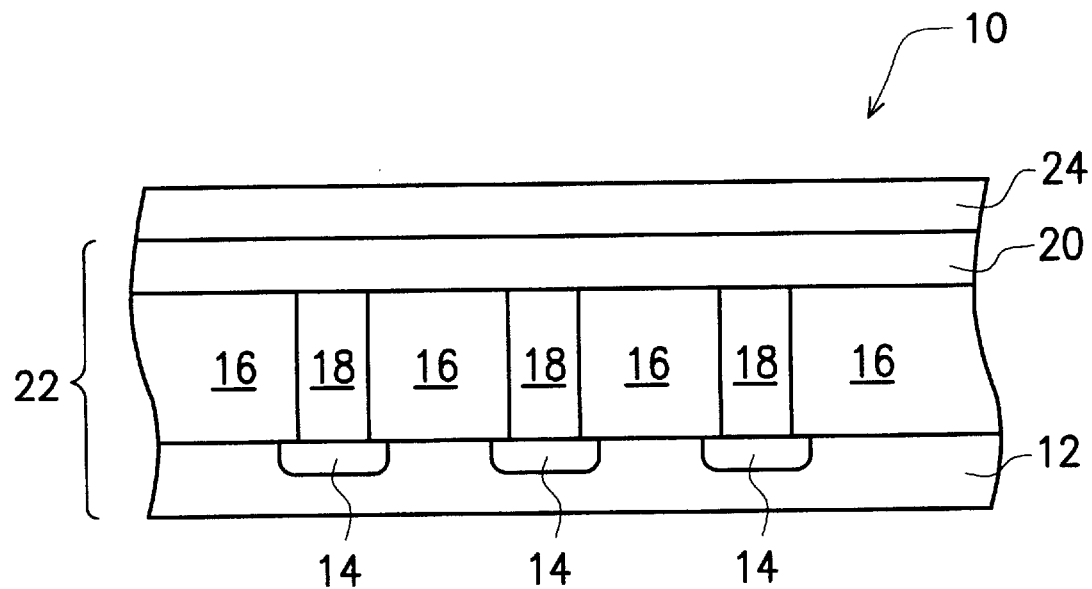
FIG. 1 to FIG. 4 show a conventional photolithography process to pattern a metal line.
Figure 2:
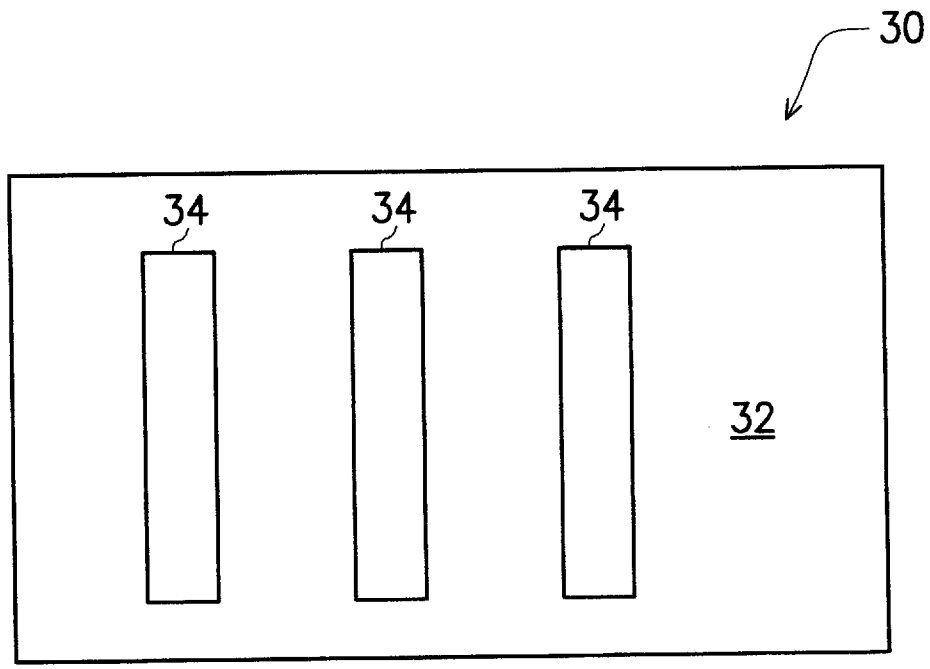
Figure 3:
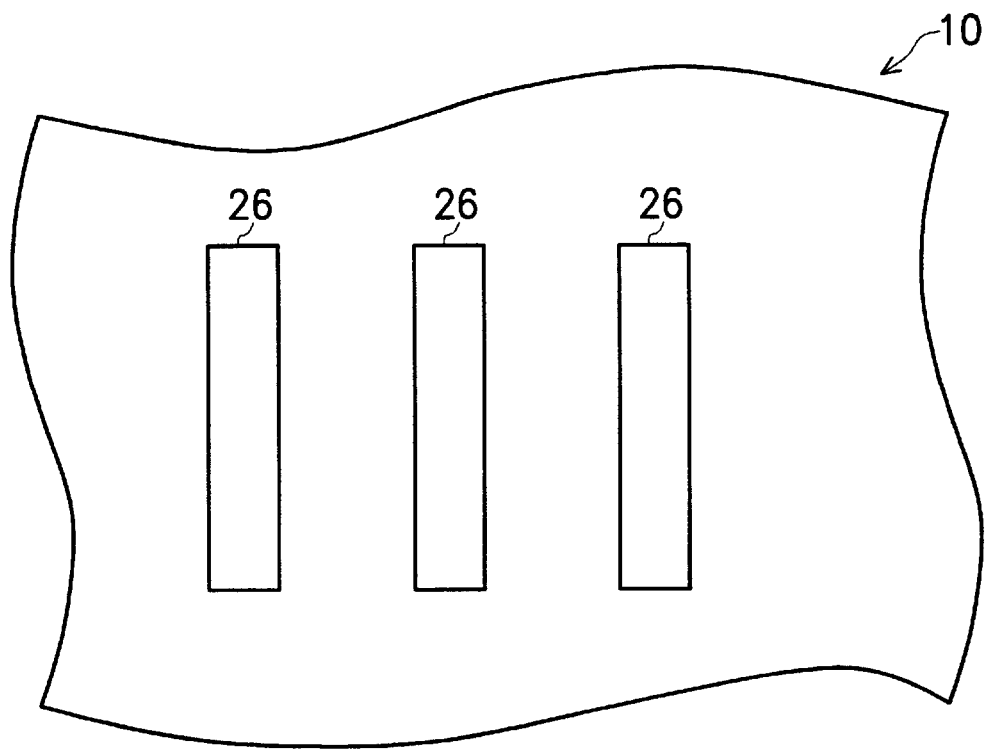
Figure 4:
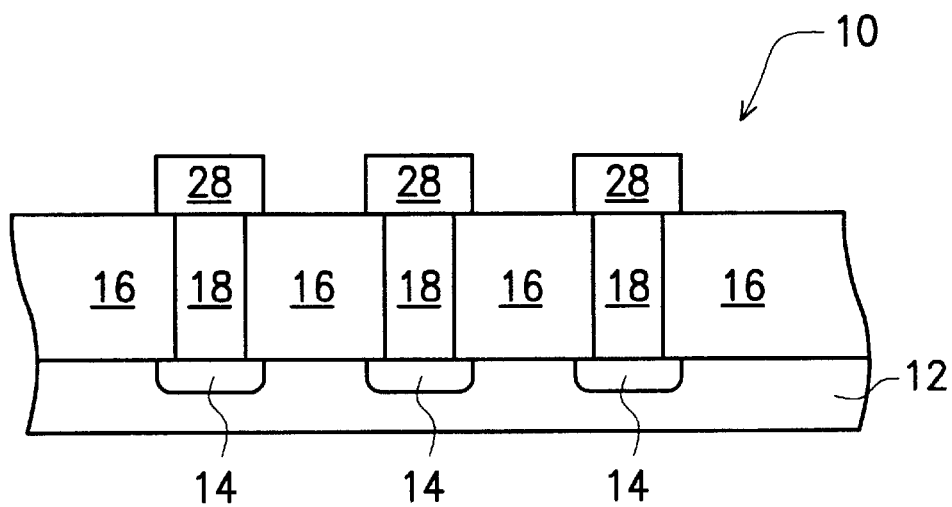
Figure 5:
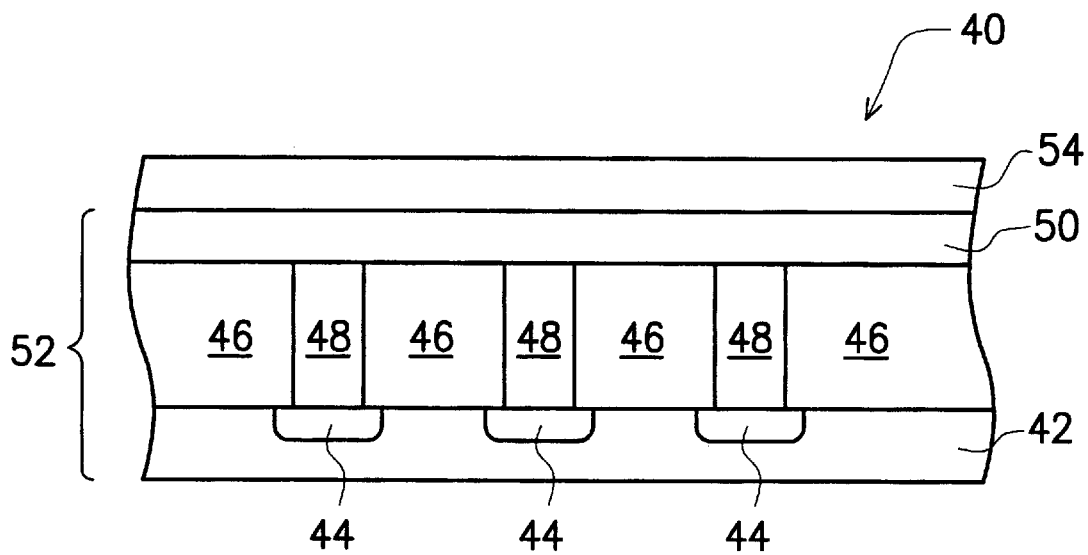
FIGS. 5–8 show a first embodiment of photolithography process according to the invention.

FIGS. 5–8 show a photolithography process to define the position and dimension of a metal line on a semiconductor chip 40 according to the invention. In FIG. 5, a substrate 52 is provided. A negative photoresist layer 52 is formed over the substrate 52. The substrate 52 further comprises a silicon substrate 42, doped regions 44 formed on the substrate, and a insulating layer 46, for example, a silicon oxide layer, formed to cover the silicon substrate 42 and the doped regions 44. Contact plugs 48, for example, tungsten plugs 48, are formed in the insulating layer 46 to connect the doped regions 44. A metal layer 50 is then formed to cover the contact plugs 48 and the insulating layer 46. As shown in FIG. 5, the photoresist layer 52 is formed on the metal layer 50.

Figure 6:
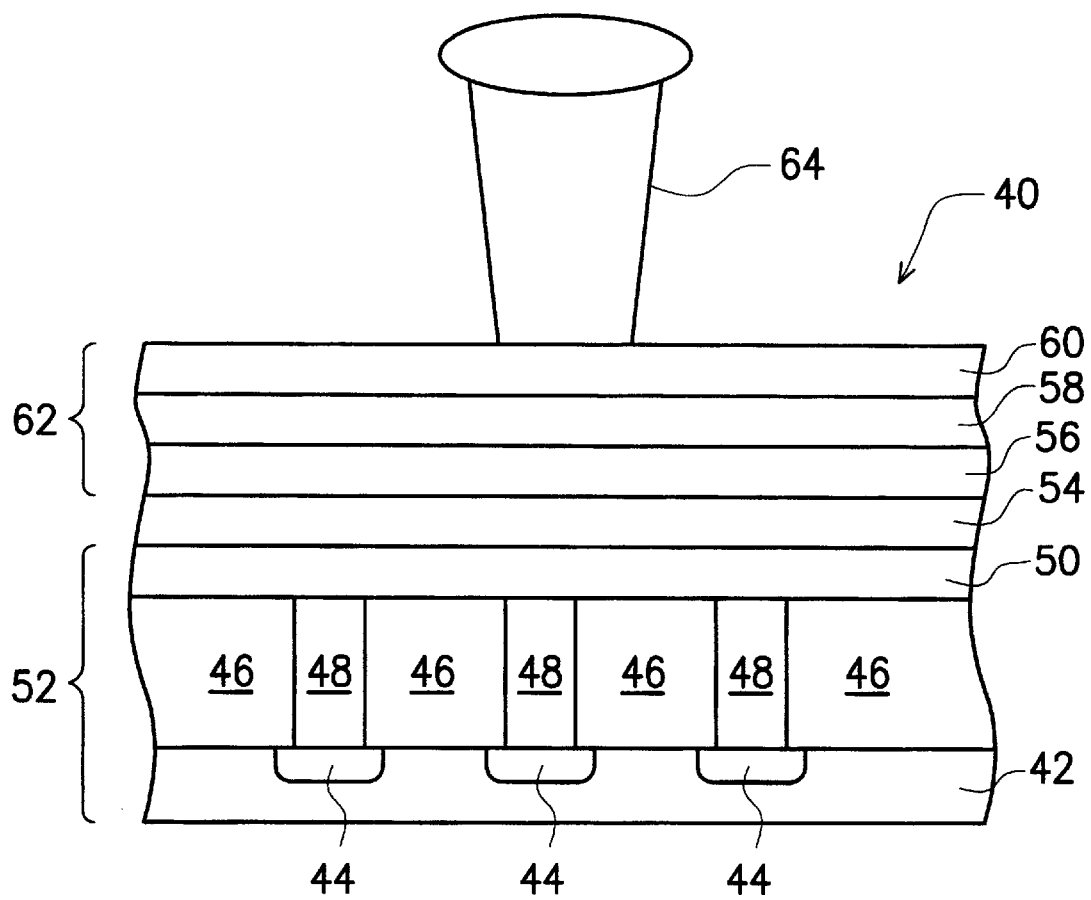

In FIG. 6, a super-resolution near-field structure 62 is formed on the photoresist layer 54. The super-resolution near field structure 62 comprising a dielectric layer 56 on the photoresist layer 54, an active layer 58 on the dielectric layer 56, and a dielectric layer 60 on the active layer 60. For example, the dielectric layer 56 has a thickness of about 15 nanometer, the active layer 58 has a thickness of about 20 nanometer, and the dielectric layer has a thickness of about 170 nanometer. The active layer 58 can be made of gallium (Ga), germanium (Ge), arsenic (As), selenium (Se), indium (In), tin (Sn), antimony (Sb), Tellurium (Te) or silver (Ag). The first and second dielectric layers comprise materials such as zinc sulfur (ZnS), silicon nitride ($SiN_x$), gallium nitride ($GaN_x$), aluminum nitride ($AlN_x$) and titanium nitride ($TiN_x$). The active layer 58 can also be made of gallium oxide ($GaO_x$), germanium oxide ($GeO_x$), arsenic oxide ($AsO_x$), selenium oxide ($SeO_x$), indium oxide ($InO_x$), tin oxide ($SnO_x$), antimony oxide ($SbO_x$), tellurium oxide ($TeO_x$) or silver oxide ($AgO_x$). Meanwhile, the materials selected to form the first and the second dielectric layers preferably comprise zinc sulfur (ZnS), silicon oxide ($SiO_x$), gallium oxide ($GaO_x$), aluminum oxide ($AlO_x$) and titanium oxide $TiO_x$).

After forming the super-resolution near-field structure 62, an exposure step is performed. A light beam 64 with a wavelength of about 365 nanameter is incident onto the semiconductor chip 40. While performing exposure, the light beam 64 is incident on positions of the photoresist layer 54 to be exposed in a mobile way. The positions of the photoresist layer 54 are then photo-chemically transformed. After the exposure, the super-resolution near-field structure 62 is removed. The semiconductor chip 40 is disposed in a developer to perform development.

Figure 7:
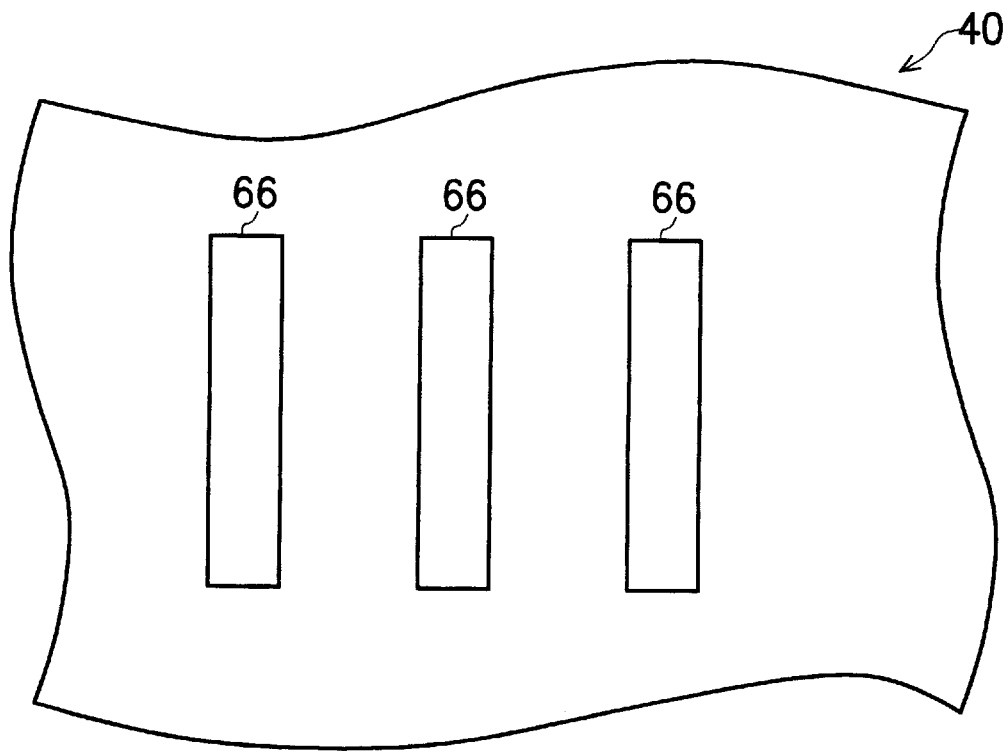
Figure 8:
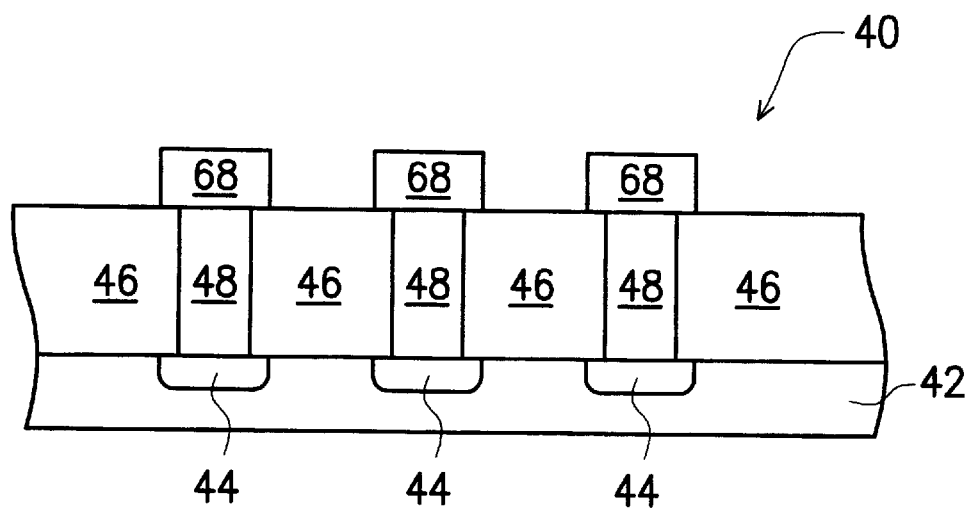

In FIG. 7, a top view of the semiconductor chip 40 after development is shown. Several cleaning steps are performed after development to remove the developer and the resolved negative photoresist layer on the semiconductor chip 40. As a result, as shown in FIG. 7, a photoresist pattern 66 is remained over the semiconductor chip 40. In FIG. 8, using the photoresist pattern 66 as a hard mask, the metal layer 50 is etched until the insulating layer 46 is exposed. The metal layer 50 is thus patterned into metal lines 68 to electrically connect the contact plugs 48.

Figure 9:
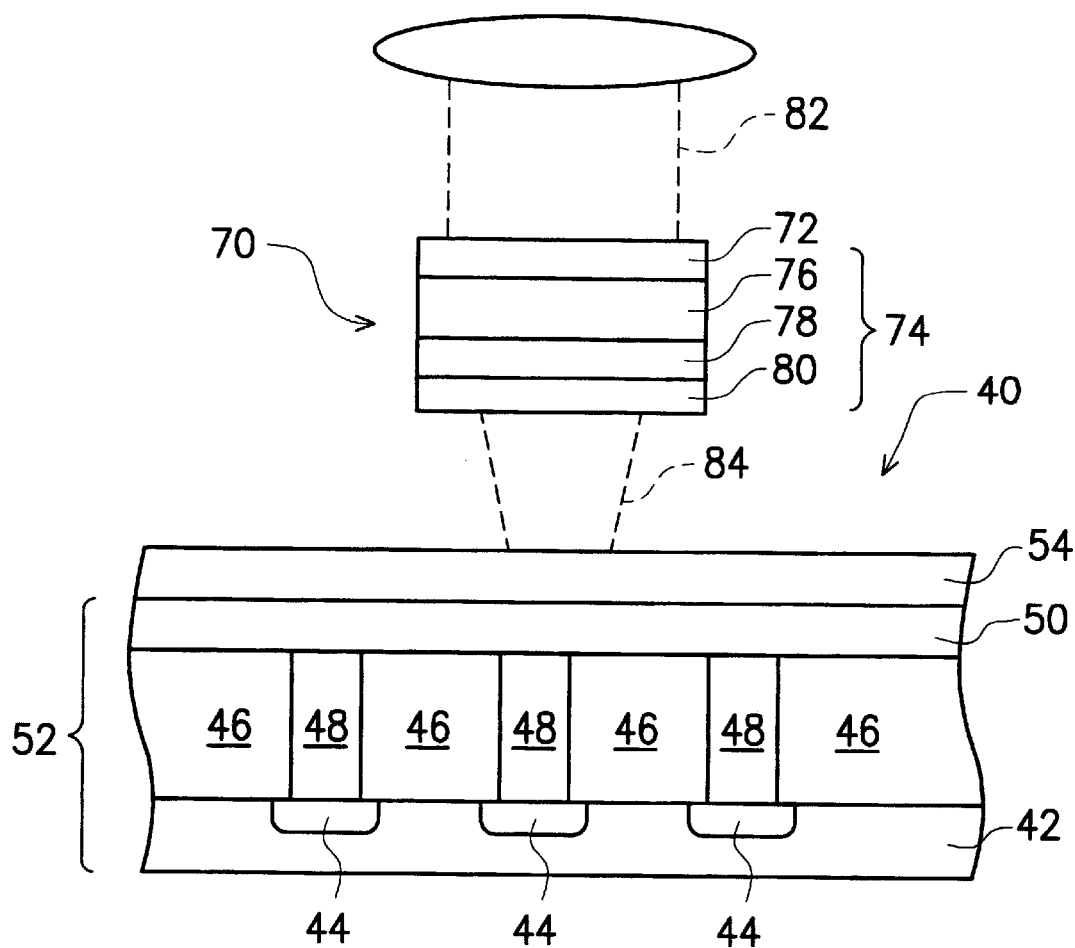
FIGS. 9–10 show a second embodiment of photolithography process according to the invention.
Figure 10:
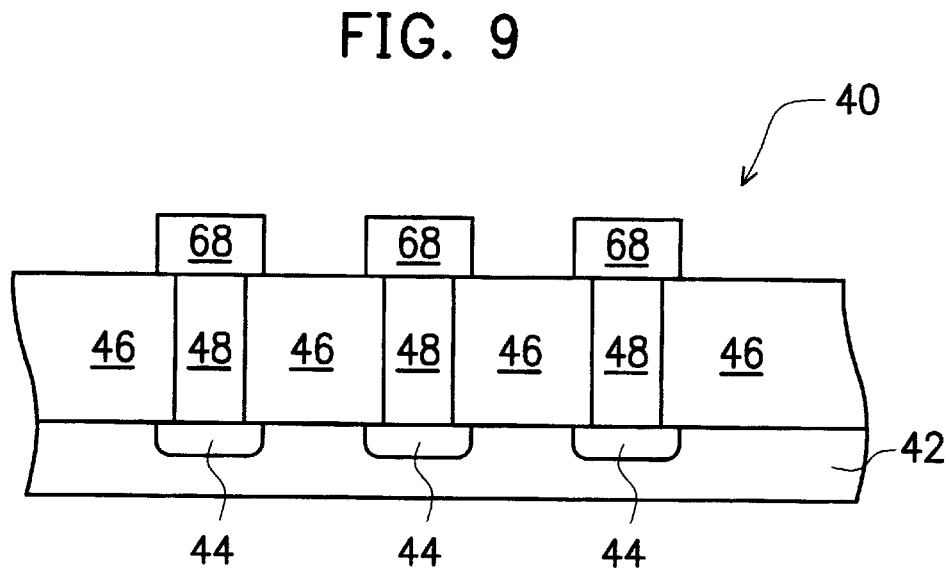

In FIG. 9, another embodiment is shown. In this embodiment, a plate 70 over the photoresist layer 54 is used to replace the super-resolution near-field structure 62. The plate 70 comprises a transparent base plate 72 and a super-resolution near-field structure 74. The super-resolution near-field structure 74 further comprises a dielectric layer 76 on the transparent base plate 72, an active layer 78 on the dielectric layer 76 and a dielectric layer 80 on the active layer 78. A light beam 82 penetrates through the plate 72 to be incident on the photoresist layer 54 for exposure. The distance between the super-resolution near-field structure 74 and the photoresist layer 54 is smaller than the wavelength of the light beam 82. The steps of development, cleaning and etching are performed to remove the photoreist layer 54, and the contact plugs 48 and metal lines 68 are then formed as shown in FIG. 10.

Figure 11:
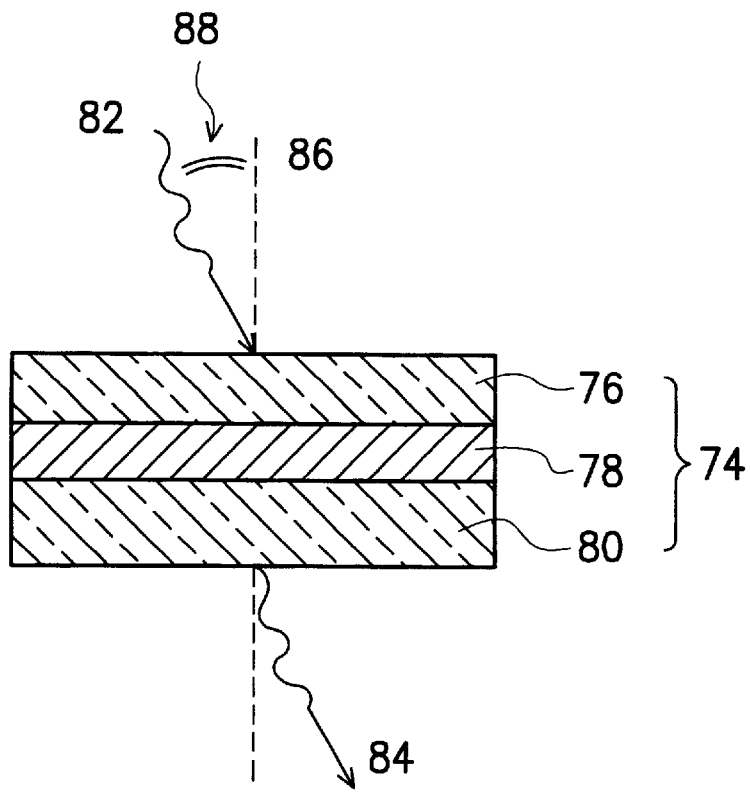
FIG. 11 is a cross sectional view showing a light beam incident on and penetrating through a super-resolution near-field structure.

FIG. 11 shows a cross section when a light beam 82 penetrates through the super-resolution near-field structure 74. When the light beam 82 travels through the dielectric layer 76, the active layer 78 and the dielectric layer 80, the transmittance and light intensity depends on the refractive index and thickness of each layer, and the incident angle 88 between the incident light beam 82 and the normal layer 86. Normally, when a light travels through a metal layer or a dielectric layer, the light intensity is reduced. However, if the light beam travels through a specially designed multi-layer structure, the light intensity may be increased. For example, with a multi-layer structure, a total reflection may be obtained when the incident angle is larger than the critical angle. With a proper multi-layer structure and thickness, a resonance may occur to obtain a higher light intensity output. Theoretically, when the absorption is negligible, hundreds of times of the light intensity are gained.

Figure 12:
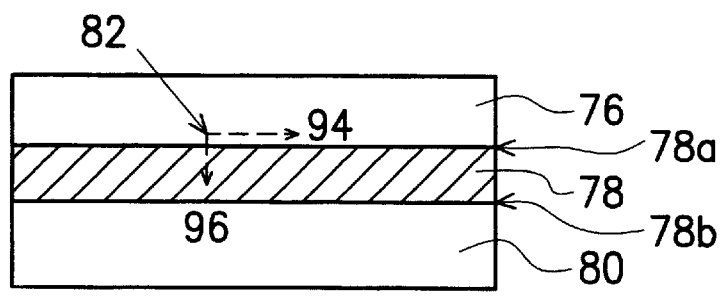
FIG. 12 shows a the component of light incident on a metal layer.

In FIG. 12, a light beam 82 incident on a surface 78a of the metal layer 78 (the active layer) has a vertical component 96 and a horizontal component 94 with respect to the surface 78a. If the magnitude of the horizontal component 94 is equal to the momentum of the free electron on the surface 78a, free electron can thus absorb a portion of the energy of the light beam 82. As a result, the free electrons are periodically distributed according to the electromagnetic field of the light beam 82. The material wave formed by the density distribution of the electrons is longitudinal wave without generating radiating electromagnetic wave along the surface 78a. However, the electric field thereof is decayed exponentially with the vertical distance to the surface 78a. On the other hand, the vertical component 96 keeps propagating in the metal layer 78. When the magnitude of the vertical component 96 reaches the standing wave condition for resolution in the multi-layer structure, that is, when the thickness of the metal layer 78 is integral multiple of half-wavelength (the wavelength that the vertical component corresponds) to cause resolution, an electromagnetic field is induced at the other surface 78b of the metal layer 78. Since the refractive index of the metal layer 78 is larger than those of the dielectric layers 76 and 80, the light is reflected within the metal layer 78 (a total reflection often occurring due to the very large refractive index of the metal layer). A constructive interference is caused to increase the light intensity on the surface 78b.

Figure 13:
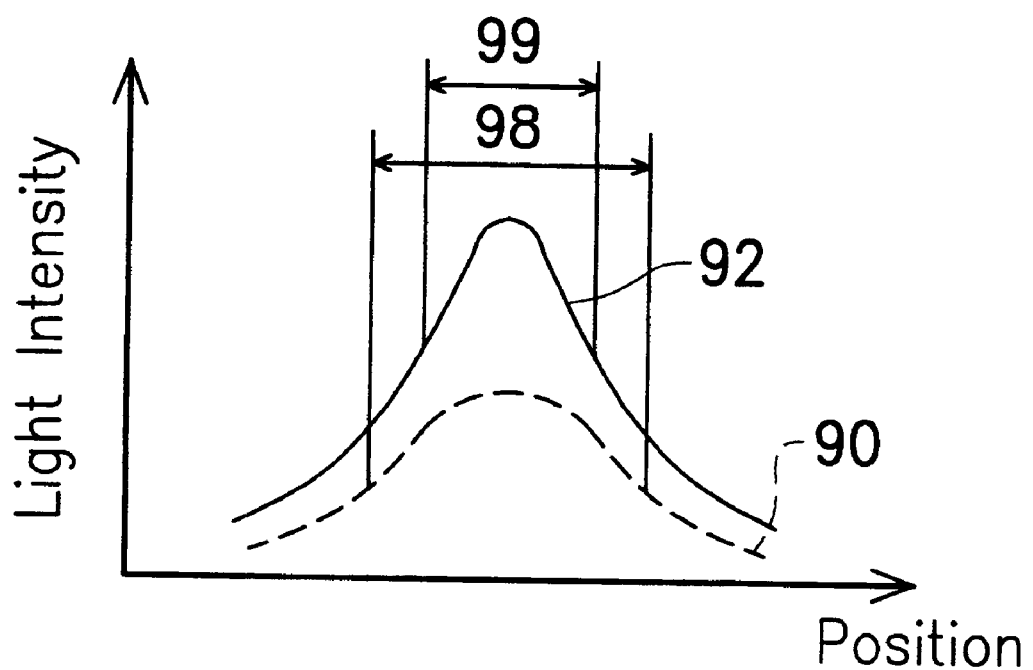
FIG. 13 shows the distributions of light intensities of an incident light beam and a transmitting light beam.

FIG. 13 shows a distribution of light intensity after the light beam 82 penetrates through the super-resolution near-field structure 74. The horizontal axis indicates the position of the light beam 82, and the vertical axis indicates the light intensity of the light beam 82. The distribution of the light intensity is approximately a Gaussian distribution. The curve 90 represents the light intensity of the light beam 82 incident on the super-resolution near-field structure 74. The curve represents the light intensity of the light beam 84 penetrating through the super-resolution near-field structure 74. Apparently, the super-resolution near-field structure greatly increases the light intensity. It is to be noted that the more central of the light beam 84 penetrating through the super-resolution near-field structure 74, the more the light intensity increases. In addition, the full width of the half magnitude (FWHM) 98 of the incident light beam 82 is larger than the full width of the half magnitude 99 of the penetrating light beam 84. Therefore, the aperture of the light beam 82 can be shrunk to form smaller line width on the photoresist layer.

In the invention, using the super-resolution near-field structure, the aperture of the exposure light source can be reduced, and the light intensity can be increased to breakthrough the resolution limit of a machine. Thus, to form a photoresist layer with a line width breaking the resolution limit is possible. By adjusting the thickness of the thin film of the super-resolution near-field structure, the aperture of the exposure light source can be shrunk, the dimension of the exposed spot on the photoresist layer is no more restricted by the resolution limit of the exposure machine.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of photolithography using a super-resolution near-field structure applied to a semiconductor chip comprising substrate and a photoresist layer on the substrate, the method comprising:

forming the super-resolution near-field structure over the photoresist layer, the super-resolution near-field structure further comprising a first dielectric layer over the photoresist layer, an active layer on the first dielectric layer, and a second dielectric layer on the active layer; and shining the semiconductor chip with a light beam, the light beam transmitting through the super-resolution near-field structure to expose the photoresist layer.

2. The method according to claim 1, wherein the step of forming the super-resolution near-field structure further comprises forming the active layer with at least one material selected from a group consisting of gallium, germanium, arsenic, selenium, indium, tin, antimony, tellurium and silver.

3. The method according to claim 2, wherein the step of forming the super-resolution near-field structure further comprises forming the first dielectric layer with at least one material selected from a group consisting of zinc sulfide (ZnS), silicon nitride ($SiN_x$), gallium nitride ($GaN_x$), aluminum nitride ($AlN_x$) and titanium nitride ($TiN_x$).

4. The method according to claim 2, wherein the step of forming the super-resolution near-field structure further comprises forming the second dielectric layer with at least one material selected from a group consisting of zinc sulfide (ZnS), silicon nitride ($SiN_x$), gallium nitride ($GaN_x$), aluminum nitride ($AlN_x$) and titanium nitride ($TiN_x$).

5. The method according to claim 1, wherein the step of forming the super-resolution near-field structure further comprises forming the active layer with at least one material selected from a group consisting of gallium oxide ($GaO_x$), germanium oxide ($GeO_x$), arsenic oxide ($AsO_x$), selenium oxide ($SeO_x$), indium oxide ($InO_x$), tin oxide ($SnO_x$), antimony oxide ($SbO_x$), tellurium oxide ($TeO_x$) and silver oxide ($AgO_x$).

6. The method according to claim 5, wherein the step of forming the super-resolution near-field structure further comprises forming the first dielectric layer with at least one material selected from a group consisting of zinc sulfide (ZnS), silicon oxide ($SiO_x$), gallium oxide ($GaO_x$), aluminum oxide ($AlO_x$) and titanium oxide ($TiO_x$).

7. The method according to claim 5, wherein the step of forming the super-resolution near-field structure further comprises forming the second dielectric layer with at least one material selected from a group consisting of zinc sulfide (ZnS), silicon oxide ($SiO_x$), gallium oxide ($GaO_x$), aluminum oxide ($AlO_x$) and titanium oxide ($TiO_x$).

8. The method according to claim 1, wherein the step of forming the super-resolution near-field structure further comprises forming the super-resolution near-field structure with a distance to the photoresist layer less than the wavelength of the light beam.

9. The method according to claim 1, wherein the step of shining the semiconductor chip with a light beam further comprises a step of shining the semiconductor chip with the light beam having a wavelength of about 365 nanometer.

10. The method according to claim 1, wherein the step of forming the super-resolution near-field structure further comprising forming the super resolution near-field structure comprising the active layer with a thickness of about 15 nanometer, the first dielectric layer with a thickness of about 20 nanometer, and the second dielectric layer with a thickness of about 170 nanometer.

11. The method according to claim 1, further comprising a step of removing the super-resolution near-field structure.

12. A method of photolithography using a super-resolution near-field structure applied to a semiconductor chip comprising a substrate and a photoresist layer on the substrate, the method comprising:

disposing a plate comprising the super-resolution near-field structure over the photoresist layer, the super-resolution near-field structure further comprising a first and a second dielectric layers and an active layer between the first and the second dielectric layers; and providing a light beam penetrating through the super-resolution near-field structure to expose the photoresist layer; wherein the light intensity of light beam is increased and the aperture of the light beam is reduced after penetrating through the super-resolution near-field structure.

13. The method according to claim 12, wherein the step of forming the super-resolution near-field structure further comprises forming the active layer with at least one material selected from a group consisting of gallium, germanium, arsenic, selenium, indium, tin, antimony, tellurium and silver.

14. The method according to claim 13, wherein the step of forming the super-resolution near-field structure further comprises forming the first dielectric layer with at least one material selected from a group consisting of zinc sulfide (ZnS), silicon nitride ($SiN_x$), gallium nitride ($GaN_x$), aluminum nitride ($AlN_x$) and titanium nitride ($TiN_x$).

15. The method according to claim 13, wherein the step of forming the super-resolution near-field structure further comprises forming the second dielectric layer with at least one material selected from a group consisting of zinc sulfide (ZnS), silicon nitride ($SiN_x$), gallium nitride ($GaN_x$), aluminum nitride ($AlN_x$) and titanium nitride ($TiN_x$).

16. The method according to claim 12, wherein the step of forming the super-resolution near-field structure further comprises forming the active layer with at least one material selected from a group consisting of gallium oxide ($GaO_x$), germanium oxide ($GeO_x$), arsenic oxide ($AsO_x$), selenium oxide ($SeO_x$), indium oxide ($InO_x$), tin oxide ($SnO_x$), antimony oxide ($SbO_x$), tellurium oxide ($TeO_x$) and silver oxide ($AgO_x$).

17. The method according to claim 16, wherein the step of forming the super-resolution near-field structure further comprises forming the first dielectric layer with at least one material selected from a group consisting of zinc sulfide (ZnS), silicon oxide ($SiO_x$), gallium oxide ($GaO_x$), aluminum oxide ($AlO_x$) and titanium oxide ($TiO_x$).

18. The method according to claim 16, wherein the step of forming the super-resolution near-field structure further comprises forming the second dielectric layer with at least one material selected from a group consisting of zinc sulfide (ZnS), silicon oxide ($SiO_x$), gallium oxide ($GaO_x$), aluminum oxide ($AlO_x$) and titanium oxide ($TiO_x$).

19. The method according to claim 12, wherein the step of forming the super-resolution near-field structure further comprises forming the super-resolution near-field structure with a distance to the photoresist layer less than the wavelength of the light beam.

20. The method according to claim 12, wherein the step of shining the semiconductor chip with a light beam further comprises a step of shining the semiconductor chip with the light beam having a wavelength of about 365 nanometer.

21. The method according to claim 12, wherein the step of forming the super-resolution near-field structure further comprising forming the super resolution near-field structure comprising the active layer with a thickness of about 15 nanometer, the first dielectric layer with a thickness of about 20 nanometer, and the second dielectric layer with a thickness of about 170 nanometer.

22. A method of photolithography, comprising:
providing a substrate comprising a photoresist layer thereon;
forming a super-resolution near-field structure over the photoresist layer, the super-resolution near-field structure is so designed that an incident light beam transmitting through has a increased light intensity and a smaller aperture; and
performing an exposure on the photoresist layer by transmitting the incident light beam through the super-resolution near-field structure.

23. The method according to claim 22, wherein the step of forming the super-resolution near-field structure comprises forming a first dielectric layer over the photoresist layer, an active layer on the first dielectric layer, and a second dielectric layer on the active layer.

24. The method according to claim 23, wherein the step of forming the super-resolution near-field structure further comprises forming the active layer with at least one material selected from a group consisting of gallium, germanium, arsenic, selenium, indium, tin, antimony, tellurium and silver.

25. The method according to claim 24, wherein the step of forming the super-resolution near-field structure further comprises forming the first dielectric layer with at least one material selected from a group consisting of zinc sulfide (ZnS), silicon nitride ($SiN_x$), gallium nitride ($GaN_x$), aluminum nitride ($AlN_x$) and titanium nitride ($TiN_x$).

26. The method according to claim 24, wherein the step of forming the super-resolution near-field structure further comprises forming the second dielectric layer with at least one material selected from a group consisting of zinc sulfide (ZnS), silicon nitride ($SiN_x$), gallium nitride ($GaN_x$), aluminum nitride ($AlN_x$) and titanium nitride ($TiN_x$).

27. The method according to claim 23, wherein the step of forming the super-resolution near-field structure further comprises forming the active layer with at least one material selected from a group consisting of gallium oxide ($GaO_x$), germanium oxide ($GeO_x$), arsenic oxide ($AsO_x$), selenium oxide ($SeO_x$), indium oxide ($InO_x$), tin oxide ($SnO_x$), antimony oxide ($SbO_x$), tellurium oxide ($TeO_x$) and silver oxide ($AgO_x$).

28. The method according to claim 27, wherein the step of forming the super-resolution near-field structure further comprises forming the first dielectric layer with at least one material selected from a group consisting of zinc sulfide (ZnS), silicon oxide ($SiO_x$), gallium oxide ($GaO_x$), aluminum oxide ($AlO_x$) and titanium oxide ($TiO_x$).

29. The method according to claim 27, wherein the step of forming the super-resolution near-field structure further comprises forming the second dielectric layer with at least one material selected from a group consisting of zinc sulfide (ZnS), silicon oxide ($SiO_x$), gallium oxide ($GaO_x$), aluminum oxide ($AlO_x$) and titanium oxide ($TiO_x$).

30. The method according to claim 22, wherein the step of forming the super-resolution near-field structure further comprises forming the super-resolution near-field structure with a distance to the photoresist layer less than the wavelength of the light beam.

\* \* \* \* \*